FABRICATION OF THIN FILM RESISTORS

Filed Dec. 12, 1963

INVENTORS: R. W. BERRY
D. A. McLEAN

BY Edward M. Fink
ATTORNEY

United States Patent Office 3,311,546
Patented Mar. 28, 1967

3,311,546
FABRICATION OF THIN FILM RESISTORS

Robert W. Berry, Berkeley Heights, and David A. McLean, Chatham, N.J., assignors to Bell Telephone Laboratories, Incorporated, New York, N.Y., a corporation of New York Filed Dec. 12, 1963, Ser. No. 330,171
6 Claims. (Cl. 204—42)

This invention relates to a method for the fabrication of precision metal film resistors and to the resistors so produced.

In recent years, miniaturization of components and circuitry has been a major development activity in the electronics industry, so creating a need for precise, accurate techniques for fabricating printed circuit components, particularly resistors.

Most of the early work in the resistor field has been directed toward the fabrication of thin film devices which evidence the combined properties of high specific resistivity, low temperature coefficient of resistance and high thermal stability, such devices, typically, evidencing resistance values ranging from 100 ohms to several megohms.

Recently, considerable interest has been generated in a class of devices requiring thin film resistors having resistance values less than 100 ohms. Unfortunately, the very short electrical paths required by film thicknesses to which the usual procedures are directed have given rise to fabrication problems. For example, a given deviation in the size of the mask designed to protect terminal metals from anodizing electrolytes results in a greater percentage change in resistor path length.

In accordance with the present invention, a technique for the fabrication of low value thin film resistors is described wherein the attendant difficulties alluded to above are avoided by the use of a second anodizable metal of high electrical conductivity as a means for defining the resistive path of the device. The inventive technique involves depositing a thin layer of a first anodizable film-forming metal on a substrate, producing a thin film of a second anodizable metal of high conductivity over such portions of the first film-forming metal, as to define basic desired path length adding terminations, in contact with the high conductivity metal forming a desired pattern of the first metal and, finally, anodizing the resultant assembly to the desired resistance value. The regions of the second metal film may be determined by any appropriate technique as by photoengraving, deposition through a mask, etching, etc. In an alternative embodiment, the second anodizable metal may be deposited directly upon the substrate prior to deposition of the first film-forming metal. First film-forming metals useful for this purpose are tantalum, niobium, titanium, vanadium, hafnium and zirconium.

While some anodizing of the second metal may necessarily result during pattern formation and/or anodizing to value the conductivity and thickness are such that the resistance value is substantially unchanged.

The invention may be more readily understood by reference to the following detailed description taken in conjunction with the accompanying drawing, wherein.

Figure 1:
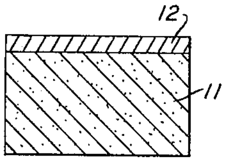
FIG. 1 is a cross-sectional view of a substrate with a layer of a first film-forming metal deposited thereon.

With further reference now to the drawing, FIG. 1 shows a substrate 11 upon which a metallic pattern is to be produced in accordance with the present invention. The first step in the inventive technique comprises cleansing techniques, as for example, ultrasonic cleaning, boiling in water, et cetera. Following the cleaning procedure, a thin layer 12 of a film-forming metal, such at tantalum, is deposited upon substrate 11 by cathodic sputtering or vacuum evaporation techniques by conventional methods described by L. Holland in "Vacuum Deposition of Thin Films," J. Wiley and Sons, 1956.

In general, the thickness of layer 12 is not critical except as it is governed by the design value of the resistance being produced. For the purposes discussed herein, such layers are preferably within the range of 100 to 5,000 Angstroms. However, it will be appreciated by those skilled in the art that such limits are not absolute and variations may be made within the scope of the invention.

Figure 2:
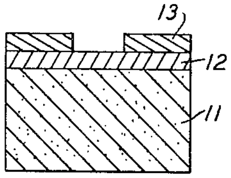
FIG. 2 is a cross-sectional view of the body of FIG. 1 with a pattern of aluminum, an exemplary "second" metal, deposited thereon.

The next step in the inventive process, depicted in FIG. 2, comprises depositing a layer of an anodizable metal of high electrical conductivity, as, for example, aluminum, in a desired pattern by cathodic sputtering or vacuum evaporation techniques. The thickness of layer 13 is at least equivalent to and is generally greater than that of layer 12. Once again, it will be appreciated that variations may be made within the scope of the invention.

Figure 3:
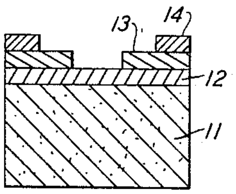
FIG. 3 is a cross-sectional view of the body of FIG. 2 after two terminals of a contact metal have been deposited thereon.

Next, following the deposition of aluminum layer 13 two terminals 14 of an electrically conductive metal, such as gold or palladium, are deposited upon layer 13 by conventional techniques, the resultant assembly being shown in FIG. 3.

Figure 4:
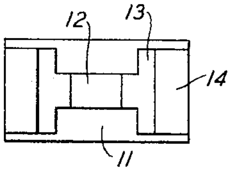
FIG. 4 is a plan view of the body of FIG. 3 after photoengraving and etaching to form a desired pattern.

Following, a pattern is photoengraved in the exposed portions of layers 12, 13 and 14 so as to completely remove certain portions thereof. Any one of the well known conventional photoengraving procedures may be use to effect this result (see "Photoengraving," Groesbeck, Doubleday Page and Company, 1924). FIG. 4 is a plan view of substrate 11 showing the pattern resulting from the removal of portions of layers 12, 13 and 14.

Following the photoengraving step, substrate 11 having portions of layers 12 and 13 exposed is anodized by means of conventional techniques, as, for example, with an ammonium pentaborate-ethylene glycol solution, at voltages ranging up to approximately 200 volts direct-current. The resultant assembly, shown in FIG. 5, includes an anodized film 15 of layer 12 and an anodized film 16 of layer 13.

The final step of the inventive technique comprises thermally stabilizing the device by heating in air at elevated temperatures in the manner described in copending application, Ser. No. 74,691 filed Dec. 3, 1960, now United States Patent 3,159,556, issued Dec. 1, 1964.

Figure 5:
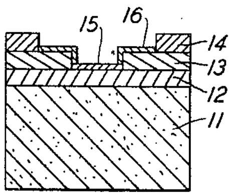
FIG. 5 is a cross-sectional view of the body of FIG. 4 after anodization.
Figure 6:
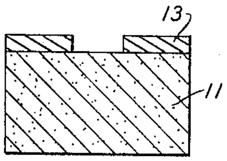
FIG. 6 is a cross-sectional view of a substrate with a pattern of an exemplary second metal deposited thereon.
Figure 7:
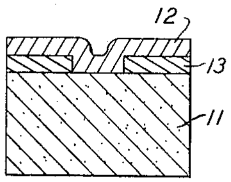
FIG. 7 is a cross-sectional view of the body of FIG. 6 with a layer of a first film-forming metal deposited thereon.
Figure 8:
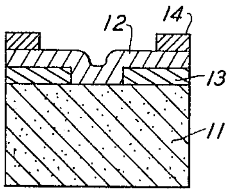
FIG. 8 is a cross-sectional view of the body of FIG. 7 after two terminals of a contact metal have been deposited thereon.
Figure 9:
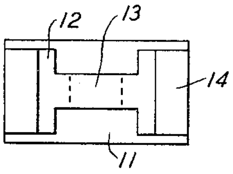
FIG. 9 is a plan view of the body of FIG. 8 after photoengraving and etching to form a desired pattern.
Figure 10:
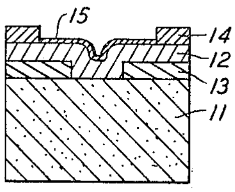
FIG. 10 is a cross-sectional view of the body of FIG. 9 after anodization.

For clarity of exposition of the design, the pattern shown in FIGS. 4 and 5 has been greatly simplified. It is to be appreciated that there is virtually no limit on the intricacy or detail of design which may be produced. Thus, a printed circuit resistor which may contain as many as twenty or thirty parallel segments joined to each other, the segments and spaces therebetween being of the order of one to two mils in width, may be produced in accordance with the general procedure outlined above. For the purposes of the present invention, the minimum area ratios or width of path between electrodes is approximately 1:10 assuming resistivity and thickness to be about equal. However, variations may be made without departing from the spirit and scope of the invention. It will also be understood that when desired precision resistors having predetermined resistance values may be obtained by anodizing to value in the manner described in H. Basseches et al. copending application, Ser. No. 845,754, filed Oct. 12, 1959, now United States Patent 3,148,129, issued Sept. 8, 1964.

The procedure described above is followed in like manner in the alternative embodiment wherein the second anodizable metal is deposited directly upon the substrate (see FIGS. 6–10).

In general, the substrate material may be composed of a material which is electrically nonconductive. Ceramic, glass, and, in general, heat resistant materials are preferred for this purpose, particularly in view of the fact that deposition of metallic layers by sputtering or vacuum evaporation tends to increase the temperature of the substrate upon which the layer is being deposited.

An example of the present invention is described in detail below. The example is intended merely as illustrative of the present invention, and it is to be appreciated that the procedures described may be varied by one skilled in the art without departing from the spirit and scope of the present invention.

*Example*

A pattern of tantalum suitable for use as a printed circuit resistor was deposited in the desired configuration in the following manner:

A glass slide, approximately ⅛ inch in width and ½ inch in length was cleaned as follows:

(a) Slide inserted in Nichrome basket, (b) Basket immersed in a wetting agent and cleaned ultrasonically for 5 minutes at room temperature, (c) Basket then immersed in second wetting agent solution and cleaned ultrasonically for 7 minutes at 75° C., (d) Slide rinsed in hot tap water for 10 minutes, (e) Slide boiled in hydrogen peroxide for 10 minutes, (f) Slide rinsed in distilled water and soaked for 15 minutes in boiling deionized water, (g) Slide dried in nitrogen for 15 minutes.

A layer of tantalum 2700 A. thick was then deposited by conventional sputtering techniques. Next, the tantalum surface was coated with a 15,000 A. pattern of aluminum by conventional evaporation techniques through a mechanical mask. Following, Nichrome-gold terminals were evaporated upon the aluminum layer by well known procedures through a mechanical mask.

Then, the entire surface of the assembly was coated with Kodak Metal Etch Resist having a viscosity of 50±5 centipoises at 28° C. by pouring the resist upon the surface of the assembly which was spinning on a turntable at 500 revolutions per minute. Spinning was continued for 2 minutes in an amber dust hood after which the assembly was dried at room temperature for 20 minutes in the absence of light and baked in a dark oven by air connection at 100° C. for 20 minutes.

Next, the resist was exposed through a negative of the desired pattern to an arc source for one minute and developed in accordance with conventional techniques.

The resist residue was removed by the use of a vigorous spray of warm water across the developed resist pattern. Following, the resist pattern was baked for 20 minutes at 100° C.

The next step consisted of etching with a potassium iodide-iodine solution prepared by adding 165 grams of iodine crystals to 100 milliliters of water and 0.25 pound of potassium iodide, followed by etching these etchants, removing unwanted Nichrome, gold and aluminum. The next step in the inventive process involved etching away excess tantalum with a reagent including 2 parts by volume water to one part 49% hydrogen fluoride and one part of concentrated nitric acid and the resist was removed by soaking in xylene.

Finally, the assembly was anodized in a solution of 30% ammonium pentaborate in ethylene glycol at a voltage of 25 volts, the gold areas being protected from the electrolyte by grease. Anodization was terminated at 0.1 milliampere/cm.$^2$ so yielding a well-defined resistor pattern of anodized tantalum.

The resultant assembly was then aged at 250° C. for 5 hours and the resistance value determined to be 9.50 ohms.

The described procedure was repeated nine times and the resultant devices evidenced resistances of 9.25, 9.10, 9.00, 8.50, 8.90, 8.70, 8.70, 8.10 and 8.60 ohms. Such resistors may now be brought to exact prescribed values by further anodizing.

While the invention has been described in detail in the foregoing description and the drawing similarly illustrates the same, the aforesaid is by way of illustration only and is not restrictive in character. The several modifications which will readily suggest themselves to persons skilled in the art are all considered within the broad scope of the present invention, reference being had to the appended claims.

What is claimed is:

1. A method for the fabrication of a metal film resistor having a short resistive path length which comprises the steps of depositing upon a non-conductive substrate (a) a first anodizable film-forming metal over a region encompassing and larger than the desired resistive path, (b) a second anodizable film-forming metal in intimate contact with said first anodizable film-forming metal over two discrete regions of such configuration that the spacing between said discrete regions equals in length the desired resistive path, and photoengraving and anodizing the resultant assembly to a specific predetermined resistive value.

2. A method in accordance with the procedure of claim 1 wherein the region of deposition of said first film-forming metal includes substantially the entirety of the said two discrete regions.

3. A method in accordance with the procedure of claim 1 wherein said first film-forming metal is deposited prior to said second film-forming metal.

4. A method in accordance with the procedure of claim 1 wherein said second film-forming metal is deposited prior to said first film-forming metal.

5. A method in accordance with the procedure of claim 1 wherein said first film-forming metal is tantalum.

6. A method in accordance with the procedure of claim 1 wherein said second film-forming metal is aluminum.

References Cited by the Examiner

UNITED STATES PATENTS

| | | | |
|---|---|---|---|
| 3,148,129 | 9/1964 | Basseches et al. | 204—38 |
| 3,159,556 | 12/1964 | McLean et al. | 204—37 |

HOWARD S. WILLIAMS, *Primary Examiner.*

W. VAN SISE, *Assistant Examiner.*